United States Patent [19]

Takahashi et al.

[11] Patent Number: 5,378,934
[45] Date of Patent: Jan. 3, 1995

[54] CIRCUIT HAVING A MASTER-AND-SLAVE AND A BY-PASS

[75] Inventors: Toshiro Takahashi, Princeton, N.J.; Masaaki Ohkawa, Tokyo; Kazuo Koide, Saitama, both of Japan

[73] Assignee: Hitachi, Ltd., Tokyo, Japan

[21] Appl. No.: 991,102

[22] Filed: Dec. 16, 1992

Related U.S. Application Data

[63] Continuation-in-part of Ser. No. 743,746, Aug. 12, 1991, Pat. No. 5,227,674.

[30] Foreign Application Priority Data

Sep. 12, 1990 [JP] Japan .................. 2-242257
Jan. 10, 1992 [JP] Japan .................. 4-021984

[51] Int. Cl.⁶ .................. H03K 3/289; H03K 17/56
[52] U.S. Cl. .................. 327/203; 327/208
[58] Field of Search .................. 307/269, 242, 272.2, 307/279; 377/79, 117, 115, 116

[56] References Cited

U.S. PATENT DOCUMENTS

| | | | |
|---|---|---|---|
| 3,917,961 | 11/1975 | Reed | 307/243 |
| 4,409,680 | 10/1983 | Schnathorst et al. | 377/79 |
| 4,584,489 | 4/1986 | Tanaka | 307/242 |
| 4,780,890 | 10/1988 | Kane | 307/269 |
| 4,970,407 | 11/1990 | Patchen | 307/272.2 |
| 5,023,475 | 6/1991 | Ducourant | 307/272.2 |
| 5,028,814 | 7/1991 | Sung et al. | 307/272.2 |
| 5,049,760 | 9/1991 | Ooms | 307/279 |
| 5,095,225 | 3/1992 | Usui | 307/279 |
| 5,148,052 | 9/1992 | Yellanilli | 307/242 |

FOREIGN PATENT DOCUMENTS 61-62878 of 0000 Japan .
59-79632 of 0000 Japan .
62-258514 of 0000 Japan .

OTHER PUBLICATIONS

"Second Generation Floating-Point Arithmetic Co-processor with a 32-Bit Bus," Nikkei Electronics, Jul. 13, 1987, pp. 123-138.

Primary Examiner—Timothy P. Callahan
Assistant Examiner—Toan Tran
Attorney, Agent, or Firm—Fay, Sharpe, Beall, Fagan, Minnich & McKee

[57] ABSTRACT

Because a bypass circuit BP connected in parallel with serial paths of first and second storage circuits MF and SF has less serially-connected stages of gates incorporated therein than the storage circuits and has shorter information transfer delay of input data to an output terminal 21 than the storage circuits, the bypass circuit BP outputs the information to the output terminal before the outputs of the storage circuits are determined when data supplied to a data input terminal 20 is fetched synchronously with a clock signal CK. The first and second storage circuits MF and SF are master/slave-operated in diagnosis mode, and the output operation of the bypass circuit BP is inhibited according to the states of signals C1 and C2 for controlling their master/slave operations regardless of the clock change of the first control signal CK. Thus, the master/slave operations of the first and second storage circuits MF and SF are assured in the diagnosis mode.

25 Claims, 11 Drawing Sheets

| INPUT | | | | | | OUTPUT |
|---|---|---|---|---|---|---|
| R | CK | D | MC1 | SWi | SiD* | Qm |
| H | L | # | H | L | # | L |
| H | H | L | H | L | # | L |
| H | H | H | H | L | # | L# |
| L | L | # | H | L | # | Qmo |
| L | H | L | H | L | # | L |
| L | H | H | H | L | # | H |
| # | # | # | L | L | # | Qmo |
| # | # | # | L | H | L | H |
| # | # | # | L | H | H | L |

(SF)

| INPUT | OUTPUT | |
|---|---|---|
| C2 | Q | Q* |
| L | Qo | Qo* |
| H | Qm | Qm* |

(SoD)

| INPUT | OUTPUT |
|---|---|
| SRi | SoD |
| L | HiZ |
| H | Q* |

| INPUT | | | | | | OUTPUT |
|---|---|---|---|---|---|---|
| R | CK | D | MC1 | SWi | SiD* | Qm |
| H | # | # | H | L | # | L |
| L | L | # | H | L | # | Qmo |
| L | ⎍ | L | H | L | # | L |
| L | ⎍ | H | H | L | # | H |
| L | H | L | ⎍ | L | # | L |
| L | H | H | ⎍ | L | # | H |
| # | # | # | L | L | # | Qmo |
| # | # | # | L | H | L | L |
| # | # | # | L | H | H | H |

(SF)

| INPUT | OUTPUT | |
|---|---|---|
| C2 | Q | Q* |
| L | Qo | Qo* |
| H | Qm | Qm* |

(SoD)

| INPUT | OUTPUT |
|---|---|
| SRi | SoD |
| L | HiZ |
| H | Q* |

4 ··· INSTRUCTION QUEUE
5 ··· INSTRUCTION REGISTER
6 ··· INSTRUCTION DECODER
7 ··· ARITHMETIC/LOGIC UNIT
8 ··· MULTIPLIER ARRAY
9 ··· BARREL SHIFTER
10 ··· ARITHMETIC REGISTER
11 ··· FLOATING POINT CONTROLLER
12 ··· MULTIPLIER CONTROLLER
13 ··· REGISTER FILE
14 ··· DATA CACHE MEMORY
15 ··· ADDRESS REGISTER
16 ··· ADDRESS CONVERSION BUFFER
17 ··· CLOCK GENERATOR

CIRCUIT HAVING A MASTER-AND-SLAVE AND A BY-PASS

This is a continuation-in-part of copending application(s) Ser. No. 07/743,746 filed on Aug. 12, 1991, now U.S. Pat. No. 5,227,674.

BACKGROUND OF THE INVENTION

The present invention relates to semiconductor integrated circuits including sequential circuits (circuits having a data storing function, in which the fan-out is determined by the present input and the stored data), more particularly to semiconductor integrated circuits, for example, microcomputers in which the logical operation timing is controlled by the clock synchronizing operation for flip-flop circuits arranged in information transfer paths.

It is possible to easily prevent malfunctions and to process data by arranging registers in information transfer paths between an arithmetic/logic units, multiplexer, shifter, decoder, and selector included in the execution section of a logic LSI such as a microcomputer and by synchronizing the registers with a clock signal. Each register comprises synchronous-type sequential circuits such as flip-flop circuits. The performance of such a logic LSI is determined by a clock signal frequency for controlling the synchronizing operation of the registers arranged in information transfer paths. That is, when data is outputted from a register synchronously with the change of the clock signal, logical operation or the like is applied to the data. The clock signal frequency is determined so that the next-stage register can receive the data synchronously with the change of the clock signal when the operation result reaches the next-stage register. This type of microcomputer is described in "Nikkei Electronics (the Jul. 13, 1987, issue, pp. 124–138" published by Nikkei-McGraw-Hill, Inc.).

SUMMARY OF THE INVENTION

However, as the result of the study by the inventor of the present invention, it is clarified that, in this type of logic LSI, the operation delay time until the data stored in a register is outputted from the register after the change of a clock signal is given to the register requires several times as long as the time in the case of general gates such as a NAND and a NOR gate or a combinational circuit (the combinational circuit is defined as a logic circuit whose output is uniquely determined when its input is determined). This is because a sequential circuit such as a flip-flop circuit includes a data-system logic gate for latching data provided between its data input and output terminals and a clock-system logic gate for synchronizing the data-system logic gate with a clock signal, resulting in a large number of serially-connected gate stages. Thus, because a conventional clock-synchronized-type flip-flop circuit produces a comparatively large delay until data output is determined after the level change of clock signal, the clock signal period is necessarily lengthened in order to secure a predetermined setup time and a predetermined hold time of data for clock signal. Thereby, the operation speed is limited of a logic LSI whose operation speed is determined by the clock signal cycle specifying the operation of the flip-flop circuit. For example, when the above flip-flop circuit is present in a critical path, the operation delay time of the flip-flop circuit prevents the operation speed of the logic LSI from increasing.

Therefore, in the previous application (U.S. Ser. No. 07/743,746, filed Aug. 12, 1991) related to a semiconductor circuit apparatus in which the logical operation timing is controlled by the clock synchronous operation for a flip-flop circuit arranged in an information transfer path, the inventor of the present invention proposed a circuit, as the flip-flop circuit, using a constitution in which a parallel circuit of a storage circuit and a bypass circuit is provided between data input and output terminals of the flip-flop circuit, the output of the bypass circuit is transferred to the output terminal when data is written in the storage circuit and the output of the storage circuit is transferred to the output terminal when data is held by the storage circuit.

For this flip-flop circuit, the bypass circuit is able to output information corresponding to the above input data at a high speed before the output from the storage circuit is determined because the bypass circuit has less serially-connected stored-gate stages and shorter delay of information transfer from the input terminal to the output terminal than the storage circuit. Therefore, the timing until the data corresponding to the input data is outputted to the output terminal of the flip-flop circuit after the input data is inputted into the input terminal of the flip-flop circuit synchronously with a clock signal is advanced and thereby, the operation of a microcomputer or the like is accelerated whose performance is determined by the clock signal cycle for specifying the operation of the flip-flop circuits.

For a semiconductor integrated circuit (hereafter referred to as an LSI), it is necessary to increase the failure detection rate using a test pattern up to approx. 100% in order to improve the mass-productivity and reliability of the circuit. For an LSI including logic circuits, it is checked whether or not various circuit elements have desired functions and performances by feeding a test-pattern input signal into the circuit from the outside. This checking is generally called diagnosis. In this case, an input test pattern must be able to diagnose every element inside. The ratio of the total number of elements to those which can be diagnosed is defined as diagnosis rate. Therefore, to create the input test pattern, it is necessary to achieve a diagnosis rate good enough for practical use with a smallest possible number of steps. In this case, it is almost impossible to improve the detection rate only by the test pattern for an LSI having thousands to tens of thousands of gates or more. Therefore, it is necessary to add a certain diagnostic circuit to the LSI. The diagnostic circuit is generally added to the LSI at the time of logical design.

Such a diagnostic circuit is disclosed in Japanese Patent Laid-Open No. 62878/1986.

The inventor of the present invention found that, to add a diagnostic function to the above flip-flop circuit with a bypass circuit, it is necessary to prevent complicated diagnosis by so controlling the master/slave operation of the flip-flop circuit under diagnostic operation that the operation is not impeded by the bypass circuit without inputting many control signals for controlling the operation from outside.

Objects of the present invention are to accelerate the logical operation of an LSI by decreasing the delay of the normal operation of a clock-synchronized-type sequential circuit having a diagnostic function and to be master/slave-operated when diagnosed and moreover to assure in-phase transfer when the clock-synchronized-type sequential circuit is in a diagnostic operation.

The above and other objects and novel features of the present invention will become apparent from the description of the specification and the accompanying drawings.

The following is the outline of a typical invention among those disclosed in this application.

In an LSI including a sequential circuit synchronized with a clock signal in FIG. 1, the sequential circuit (FF) has a first storage circuit (MF) which is controlled to assume the write state in which data can be written and outputted and the hold state in which the data can be held and outputted, a second storage circuit (SF) whose write state and hold state are controlled, and a bypass circuit (BP). In the first storage circuit (MF), the states where the data supplied from a main data input terminal (20) can be written and held are controlled in accordance with first and second control signals (CK and MC1). In the second storage circuit (SF), the states where the output data of the first storage circuit (MF) can be written and held are controlled in accordance with a third control signal (C2). The bypass circuit (BP) is connected to the main data input terminal (20) and a data output terminal (21), and has a transfer time shorter than the data transfer time taken for the data to be transferred from the main data input terminal (20) to the data output terminal (21) through both storage circuits (MF and SF), in other words, has a number of serially-connected gate stages smaller than the number of serially-connected gate stages between the main data input terminal (20) and the data output terminal (21) through both storage circuits (MF and SF). The output operation of the bypass circuit (BP) is inhibited in response to the states of the second and third control signals (MC1 and C2) for master/slave-operating the first storage circuit (MF) and the second storage circuit (SF) and enabled according to the state of the third control signal (C2) for giving an instruction the second storage circuit (SF) to be in a continuous write state and the states of the first and second control signals (CK and MC1) for controlling the state where the data sent from the main data input terminal (20) is written in the first storage circuit (MF).

To enable the scan-in of diagnostic data from a scan bus, it is necessary to further control the states for writing and holding the diagnostic data (SiD) sent from a diagnostic data input terminal (25) in accordance with a fourth control signal (SWi).

To enable the scan-out of diagnostic data to the scan bus, it is necessary to further add a diagnostic data output terminal (23) connected to the output of the second storage circuit (SF).

The bypass circuit (BP) sends information directly to the output terminal (21) without passing the information through the storage circuits (MF and SF). In this case, to prevent the contention between the information held before written in the storage circuit (MF) and the output information of the bypass circuit (BP), it is necessary to provide an output gate circuit (G1) to be cut-off-controlled in response to the output ready state of the bypass circuit (BP) between the output of the second storage circuit (SF) and the data output terminal (21).

To stabilize the operation of a clock-synchronous-type sequential circuit regardless of its applied mode or to standardize the operation specifications, it is necessary to add a driver circuit for driving a load connected to the data output terminal (21) to the bypass circuit (BP) in such a way that the setup time and hold time of the sequential circuit do not greatly depend on the amount of a capacitive load connected to the data output terminal.

When the first storage circuit (MF) has a reset function, it is necessary to also provide the bypass circuit (BP) with a reset function in order to give priority to a reset instruction of the first storage circuit. That is, it is necessary to provide the bypass circuit (BP) with means (e.g., MN3 and MP3 in FIG. 5) for forcing the data to be outputted to the data output terminal (21) into a predetermined logical value in response to a fifth control signal (e.g., R in FIG. 5). The first storage circuit (MF) has means (e.g., NR1 in FIG. 5) for forcing its holding data into a predetermined logical value in response to the fifth control signal.

By the above means, in the normal operation mode, the first storage circuit (MF) is so controlled in accordance with the clock change of the first control signal (CK) that it can assume the write state and hold state, and the second storage circuit (SF) is controlled in the data-through state. In this case, the bypass circuit (BP) is brought into the state ready to output the data sent from the main data input terminal (20) to the output terminal (21) in response to the write control over the first storage circuit (MF). Because the bypass circuit (BP) performs no storing operation and has less serially-connected stored-gate stages than the storage circuit (MF) and less information transfer delay between the main data input terminal (20) and the data output terminal (21) than the storage circuit, it outputs the information corresponding to the input data at a high speed before the output of the storage circuit (SF) is determined. Thus, the timing until the data inputted to the input terminal (20) of the sequential circuit is outputted to the output terminal (21) synchronously with the clock signal change is advanced. This decreases the operation delay of a clock-synchronized-type sequential circuit. Therefore, because the clock signal frequency of an LSI of a microcomputer or the like whose performance is determined by the clock signal frequency for specifying the operation of the sequential circuit can be increased, it is possible to accelerate the logical operation of the LSI.

In the diagnosis mode, the first and second storing circuits (MF and SF) are master/slave-operated and the output operation of the bypass circuit (BP) is inhibited in response to the states of the signals (MC1 and C2) for controlling the storing circuits. When the output of a combinational circuit is set to a sequential circuit of the receiving side, the input of the next-stage combinational circuit does not change. Therefore, it is possible to mutually in-phase-transfer-control the sequential circuits arranged before and after the combinational circuit even if the signal frequency of the control-clock or synchronizing-clock signal frequency under diagnosis is lower than that under normal operation or the waveform of the signal is not sharp. Moreover it is possible to remove the restrictions such as the inhibition of a feedback circuit in the logical design of a gate array LSI by a user. Furthermore, in this case, the first control signal (CK) is not necessarily a clock signal and it can be considered to be equivalent to a logical signal. Therefore, any signal waveform can be used for diagnosis. In other words, any consideration of a clock system like the first control signal in diagnosis is unnecessary in the logical design.

Reference is made to our copending U.S. application Ser. No. 07/743,746, filed Aug. 12, 1991, the subject matter of which is incorporated herein by reference.

BRIEF DESCRIPTION OF THE DRAWINGS

FIG. 6 is a truth table of the circuit shown in FIG. 5;

FIG. 9 is a truth table of the circuit shown in FIG. 8;

DESCRIPTION OF THE PREFERRED EMBODIMENTS

Figure 10:
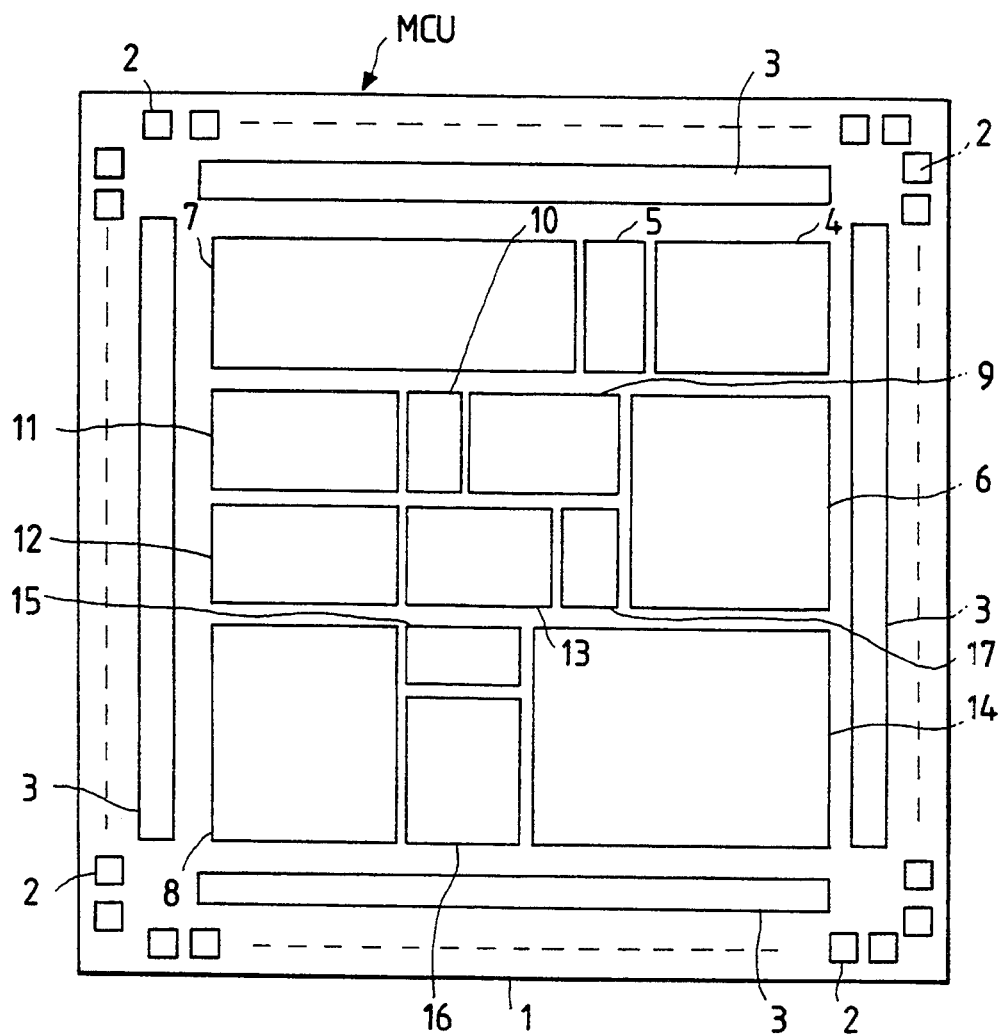
FIG. 10 is a chip layout of a microcomputer related to an embodiment of the present invention.

FIG. 10 is the chip layout of a microcomputer related to an embodiment of the present invention. In this specification the microcomputer having a central processing unit is widely understood as a data processing LSI for executing data processing. A digital signal processor is included in the concept.

In FIG. 10, numeral 1 is a semiconductor substrate made of, for example, silicon. Many bonding pads 2 are arranged in the periphery of the semiconductor substrate 1 and an area 3 where input, output, and input-/output buffers are also provided in the periphery. An instruction control section is constituted inside the area 3, which includes an instruction queue 4 for pre-fetching an instruction, an instruction register 5 for receiving the instruction from the instruction queue 4 according to a predetermined procedure, and an instruction decoder 6 for decoding the instruction held by the instruction register 5 and generating various control signals. Moreover, operating means including an arithmetic/logic unit 7, multiplier array 8, barrel shifter 9, and arithmetic register 10, a floating point controller 11 and multiplier controller 12 are constituted inside the area. In addition, a register file 13, data cache memory 14, address register 15, address conversion buffer 16, and clock generator 17 are also constituted inside the areas. After the instruction decoder 6 decodes an instruction fetched by the instruction register, the microcomputer MCU performs operations of data and addresses through arithmetic units and registers.

Figure 11:
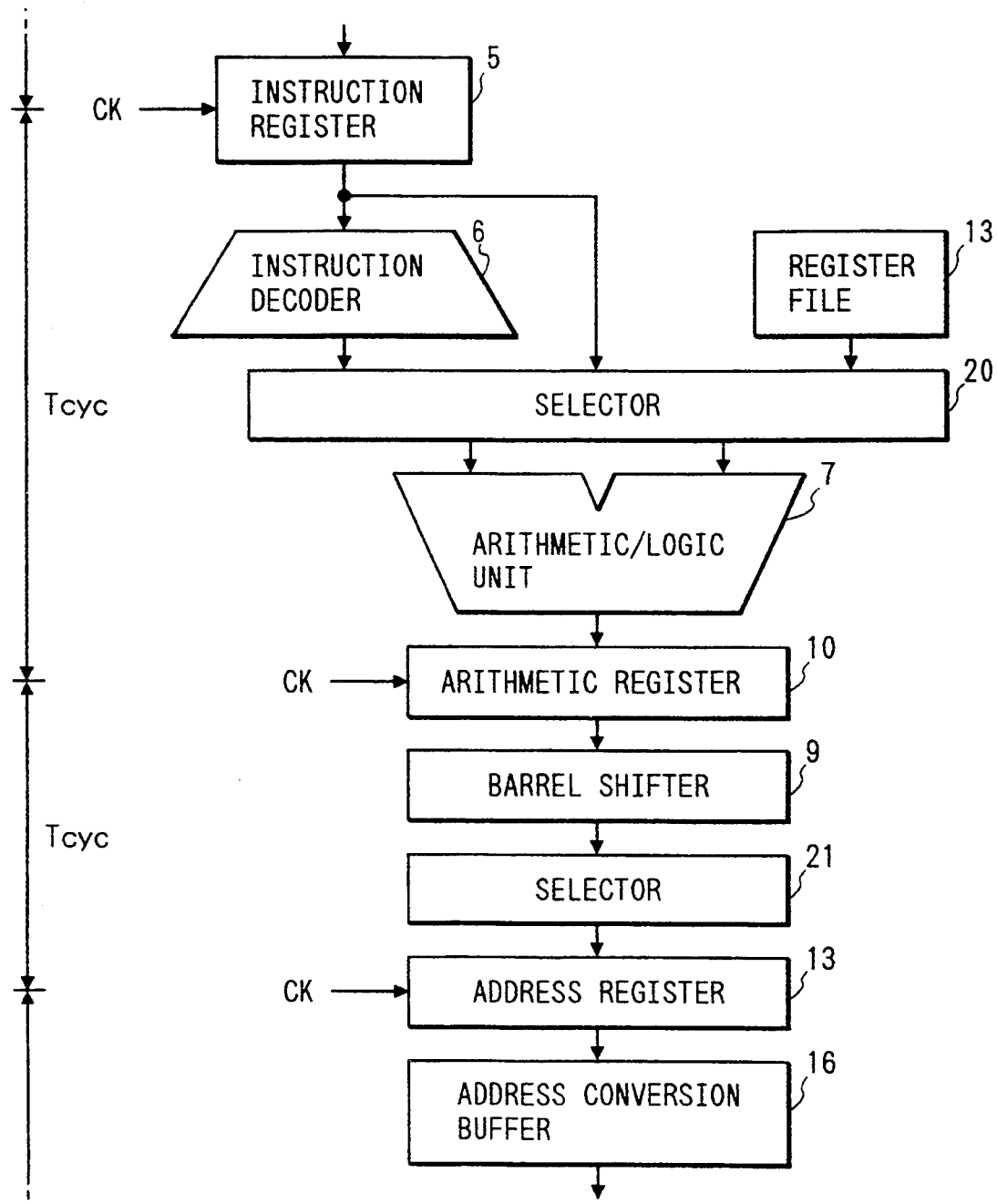
FIG. 11 is an explanatory view showing an information transfer path, e.g., a critical path for indexing the performance of the microcomputer shown in FIG. 10.

FIG. 11 shows an information transfer path such as a critical path for indexing the performance of the microcomputer shown in FIG. 10. The critical path in FIG. 11, though not restricted, is a path for generating an address by a jump instruction. The arithmetic register 10 and address register 15 write data synchronously with, for example, the clock signal CK and holds and outputs the data in the normal operation mode. The instruction register 5 writes an instruction synchronously with the clock signal CK and holds and outputs the instruction. The instruction outputted from the instruction register 5 is decoded by the instruction decoder 6 and supplied to the arithmetic/logic unit 7 through the selector 20. The result of the operation in the unit 7 is transferred to the arithmetic register 10. To correctly transfer the operation result to the succeeding stage in such a way that no malfunction occurs, the data of the operation result must reach the input of the arithmetic register 10 before the next cycle of the clock signal CK, that is, within the cycle time Tcyc. Similarly, the information obtained by operating the data outputted from the arithmetic register 10 by the barrel shifter 9 and transferred to the address register 15 from the selector 21 must reach the input of the address register 15 within the cycle time Tcyc. The arithmetic register 10 and address register 15 comprise flip-flop circuits serving as clock-synchronized-type sequential circuits whose number corresponds to the number of bits of the registers 10 and 15. The instruction decoder 6 and arithmetic/logic unit 7 comprise combinational circuits including NAND gates, NOR gates, inverter gates, etc. As represented by the critical path in FIG. 11, it is necessary to shorten the cycle time Tcyc in order to increase the data processing speed of the microcomputer MCU of this embodiment in which its logical operation timing is controlled by the clock synchronous operation for flip-flop circuits arranged in the information transfer paths. Therefore, it is necessary to shorten the operation delay times of combinational circuits including NAND gates and so forth and to shorten the delay times as much as possible until normal data are outputted from flip-flop circuits after the clock signal CK changes.

Figure 1:
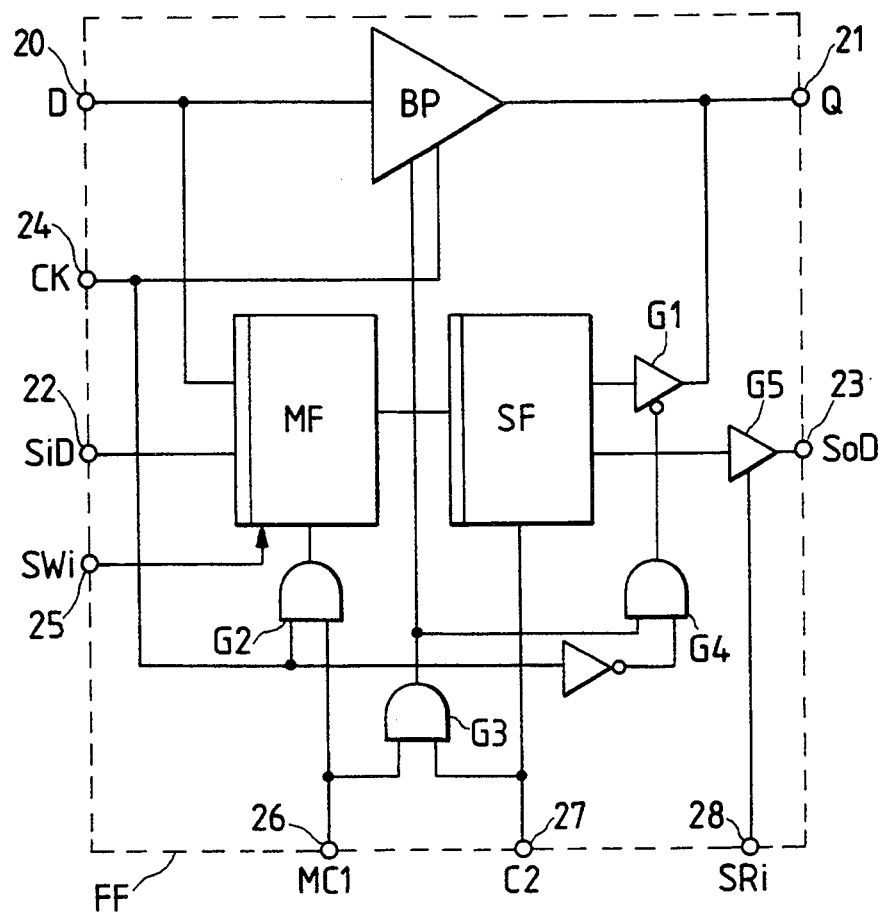
FIG. 1 is a block diagram of an embodiment of the flip-flop circuit according to the present invention.

FIG. 1 shows an embodiment of the flip-flop circuit for constituting various registers mentioned above. The flip-flop circuit FF shown in FIG. 1, though not restricted, has the input terminal 20 for data D, output terminal 21 for data Q, input terminal 22 for scan-in data SiD, output terminal 23 for scan-out data SoD, input terminal 24 for clock signal CK, input terminal 25 for scan write signal SWi, input terminal 28 for scan read signal SRi, input terminal 26 for diagnostic master clock signal MC1, and input terminal 27 for diagnostic slave clock signal C2 as external terminals, and moreover has the first storage circuit MF having a write state where data can be written in the storage circuit MF and outputted therefrom is controlled and having a hold state where the data is held therein and outputted therefrom is controlled, the second storage circuit SF whose write state and hold state is controlled, and the bypass circuit BP.

In the first storage circuit MF, the states where the data D supplied from the data input terminal 20 is written in the storage circuit MF and held therein is controlled in accordance with the clock signal CK and diagnostic master clock signal C1. The clock signal CK and diagnostic master clock signal C1, for example, is used to obtain the logical multiplication by the AND gate G2. The first storage circuit MF is brought into the write state by the high level (logic "1" in this embodiment) of the logical multiplication output and to the hold state by the low level (logic "0" in this embodiment) of the output.

In the second storage circuit SF, the states where data is written and held therein is controlled in accordance with the diagnostic slave clock signal C2. According to this embodiment, the second storage circuit SF is brought into the write state by the high level of the diagnostic slave clock signal C2 and into the hold state by the low level.

The bypass circuit BP is connected to the data input terminal 20 and data output terminal 21, which has a transfer time shorter than the data transfer time until the data supplied from the data input terminal 20 reaches the data output terminal 21 through the both storage circuits MF and SF. In other words, the number of serially-connected gate stages through which the data supplied from the data input terminal 20 reaches the output terminal 21 is smaller than the number of gate stages in the path passing the storage circuits MF and SF. In this case, the number of serially-connected gate stages means the number with respect to both the data and clock systems. The output operation of the bypass circuit BP is controlled by the clock signal CK and the output logical multiplication signal of the AND gate G3 adopting a logical multiplication by receiving the diagnostic master clock signal MC1 and diagnostic slave clock signal C2.

In the normal operation mode (normal operation mode other than LSI diagnosis) of the flip-flop circuit FF, the diagnostic master clock signal MC1 and diagnostic slave clock signal C2 are brought into the high level. Thereby, the second storage circuit SF is always brought into the write state and kept in the data-through state. In the first storage circuit MF, the write state and hold state are alternately changed in accordance with the clock change of clock signal CK. In the above state, the bypass circuit BP receiving the clock signal CK and the output signal of the AND gate G3 is controlled to be ready for the output operation synchronously with the high level of the clock signal CK. Because the bypass circuit (BP) performs no storing operation and has less serially-connected stored-gate stages than the storage circuits MF and SF, and has less information transfer delay between the main data input terminal (20) and the data output terminal (21) than the storage circuits MF and SF, it outputs the information corresponding to the input data at a high speed before the output of the second storage circuit SF in the data-through state is determined. Thus, the timing until the data inputted to the input terminal 20 of the flip-flop circuit FF is outputted to the output terminal 21 synchronously with the change of the clock signal CK is advanced. Thereby, it is possible to decrease the operation delay of the clock-synchronized-type flip-flop circuit FF. In a microcomputer MCU whose performance is determined by the frequency of the clock signal CK for specifying the operation of a flip-flop circuit, the frequency of the clock signal CK can be increased. Therefore, it is possible to operate the microcomputer MCU at a high speed.

In the diagnosis mode, the clock signal CK is considered to be equivalent to a logical signal, and the high level of the clock signal CK makes it possible to control the first storage circuit MF synchronously with the change of the diagnostic master clock signal MC1. Because the diagnostic master clock signal MC1 and diagnostic slave clock signal C2 are clock-changed without overlap, the first and second storage circuits MF and SF are master/slave-operated. In this state, the output of the AND gate G3 is fixed to the low level and thereby the output operation of the bypass circuit BP is inhibited regardless of the logical level of the clock signal CK. In other words, the master/slave operation of the first and second storage circuits MF and SF is assured. Therefore, because the output of the next-stage combinational circuit does not change when setting the output of the combinational circuit into a receiving-side flip-flop circuit in the diagnosis mode, it is possible to alternately perform the in-phase transfer control of the flip-flop circuits arranged before and after the combinational circuit even if the signal frequency of the control-clock or synchronous-clock signal frequency in diagnosis is lower than that under normal operation or the waveform of the signal is not sharp. Moreover it is possible to remove the restrictions such as the inhibition of a feedback circuit in the logical design of a gate array LSI by a user. Furthermore, in this case, the clock signal CK is not necessarily a clock signal and it can be considered to be equivalent to a logical signal. Therefore, any signal waveform can be used for diagnosis. In other words, any consideration for a clock system under diagnosis is unnecessary for logical design.

During diagnosis, the scan-in data SiD is written by the transition to the high level of the scan write signal SWi and brought into the hold state by the transition to the low level of it. The scan-in data SiD thus written and held is written in the second storage circuit SF synchronously with the transition to the high level of the diagnostic slave clock signal C2 and outputted, and the data is held by the low level of the diagnostic slave clock signal C2 and outputted. During diagnosis, the information held by the second storage circuit SF is outputted as the scan-out data Sod from the terminal 23 through the output gate G5 when the scan read signal SRi goes to the high level.

In the normal operation mode, the bypass circuit BP transfers the data D to be written in the circuit directly to the output terminal 21 without passing the data through the storage circuits MF and SF. In this case, the output gate circuit G1 is provided between the output of the second storage circuit SF and the data output terminal 21 in order to prevent the contention between the held information before written in the first storage circuit MF and the output information of the bypass circuit BP. The output gate circuit G1 is controlled by the output of the AND gate G4 by which the logical multiplication of the output of the AND gate G3 and the inverted signal of the clock signal CK is obtained. The output of the output gate circuit G1 is inhibited when the output of the AND gate G4 is at the high level and enabled when it is at the low level. Therefore, the first storage circuit MF is brought into the write state by the transition to the high level of the clock signal CK in the normal operation in which the diagnostic master clock signal MC1 and diagnostic slave clock signal C2 are at the high level. Moreover, the output gate circuit G1 is brought into the cutoff state when the output operation of the bypass circuit BP is allowed and the contention between the information held before written in the first storage circuit MF and the output information of the bypass circuit BP. When the clock signal CK goes to the low level, the output operation of the bypass circuit BP is disabled, and simultaneously, when the first storage circuit MF is forced into the hold state, the output of the AND gate G4 is inverted, the output gate G1 is made ready for the output operation, and the output of the first storage circuit MF kept in the hold state is given to the output terminal 21 through the second storage circuit SF. In this case, the output operation of the bypass circuit BP is inhibited by the clock signal CK at low level. Under diagnosis when the diagnostic master clock signal CM1 and diagnostic slave clock signal C2 are clock-changed without overlap, the output of the AND gate G3 is kept at the low level. Therefore, the output gate circuit G1 is always made ready for the output operation and the master/slave operation of the first storage circuit MF and second storage circuit SF is not influenced.

Figure 2:
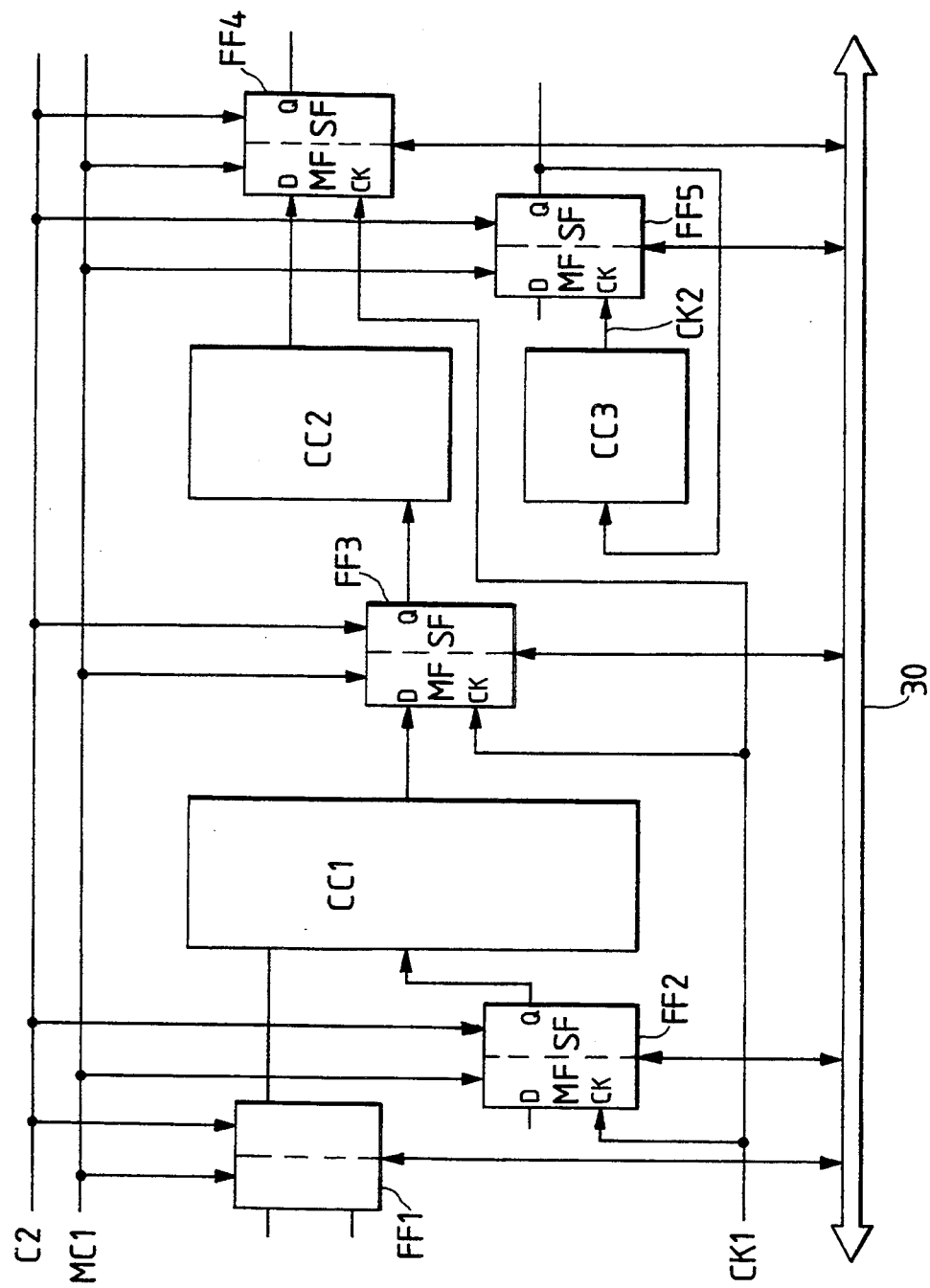
FIG. 2 is a partial functional block diagram mainly illustrating the flip-flop circuit in FIG. 1 under diagnosis.

FIG. 2 shows a partial functional block diagram mainly illustrating the flip-flop circuit FF under diagnosis. The constitution shown in FIG. 2 is made by using a dividing diagnosis technique in which the entire circuit is divided into sequential circuit groups and combinational circuit groups formed between the sequential circuit groups and the diagnosis only for the combinational circuit group is performed instead. In FIG. 2, five flip-flop circuits FF1 to FF5 that are the same as the flip-flop circuit FF are typically shown and three combinational circuit groups CC1, CC2, and CC3 are typically shown. The diganostic master clock signal MC1 and diagnostic slave clock signal C2 are supplied to each flip-flop circuit in common. The scan-in data SiD is given to the flip-flop circuits FF1 to FF5 from the scan bus 30 and the scan-out data SoD is given to the scan bus 30. The output data D of the flip-flop circuit FF2 is used as the input data of the flip-flop circuit FF3 through the combinational circuit group CC1. The output data D of the flip-flop circuit FF3 is used as the input data of the flip-flop circuit FF4 through the combinational circuit group CC2. The control signal CK1 corresponds to the clock signal CK in FIG. 1, which is used for the flip-flop circuits from FF2 to FF4 in common in this embodiment and is used for the so-called in-phase transfer. The output data Q of the flip-flop circuit FF5 is supplied to the combinational circuit group CC3 and the output of the group CC3 is fed back to the flip-flop circuit FF5. The signal CK2 corresponds to the clock signal CK in FIG. 1.

Figure 3:
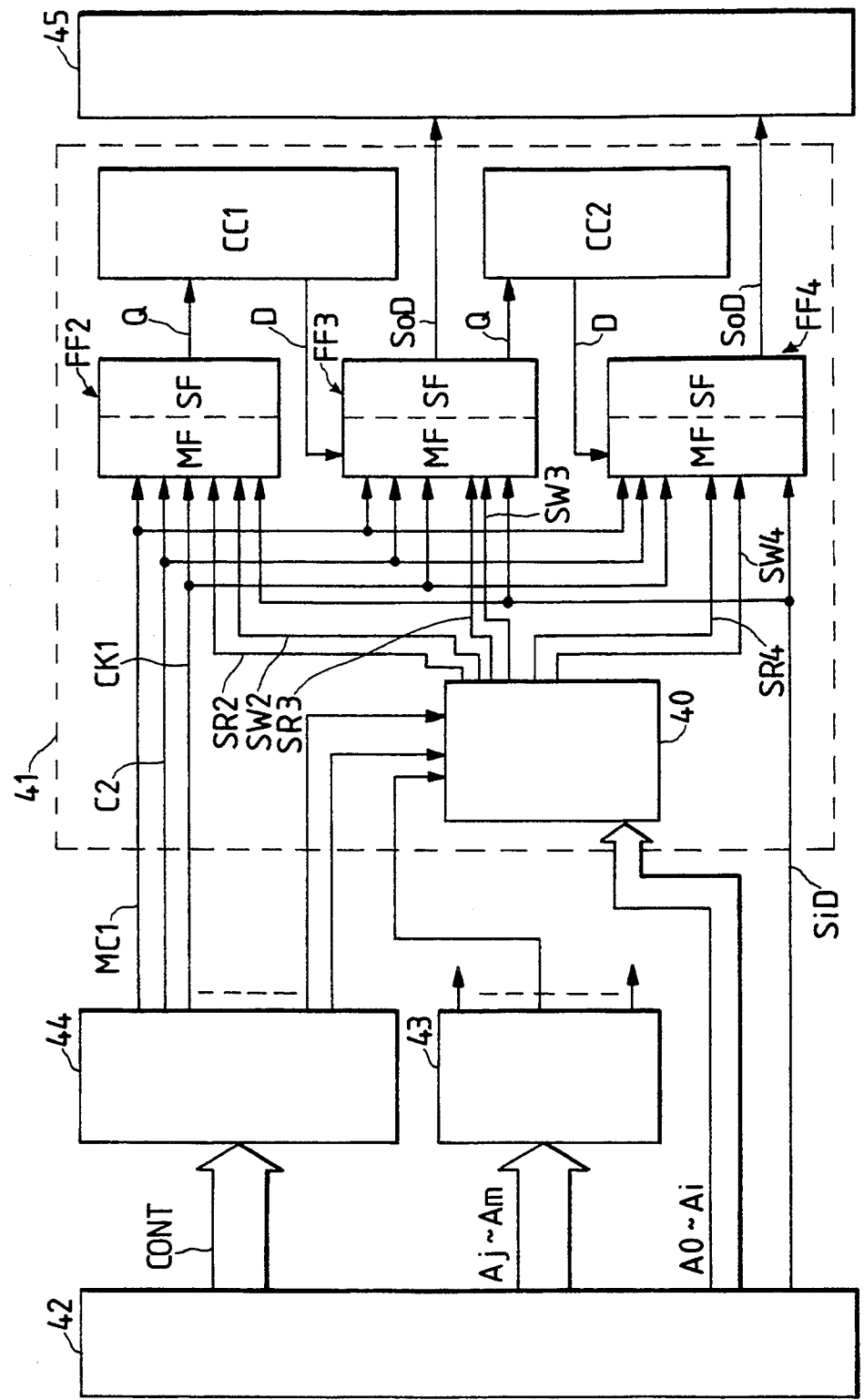
FIG. 3 is an overall functional block diagram of a diagnostic circuit constitution in the case of controlling the functional block in FIG. 2 by the address scan method.

FIG. 3 shows the overall functional block of the diagnostic circuit constitution in the case of controlling the functional block in FIG. 2 by the address scan method. In FIG. 3, flip-flop circuits from FF2 to FF4 and combinational circuit circuit groups CC1 and CC2 are typically shown as a functional block corresponding to those in FIG. 2. They constitute a predetermined logical block 41 together with a low-order address decoder 40. Though not shown in FIG. 3, there are many other logical blocks represented by the logical block 41. High-order address signals Aj to Am fetched through a diagnostic data input section 42 are supplied to a high-order address decoder 43 to generate a signal for selecting a logical block specified by the high-order address signal. The selection signal actuates the low-order address decoder of the logical block predetermined correspondingly to the signal. The low-order address signals A0 to Ai fetched through the diagnostic data input section 42 are supplied to each low-order address decoder represented by the low-order address decoder 40. When the low-order address decoder 40 is actuated, it decodes the low-order address signals A0 to Ai and generates a scan write signal SWi for specifying a flip-flop circuit in which the scan-in data SiD is to be written and a scan read signal SRi for specifying a flip-flop circuit from which the scan-out data SoD is to be read. In FIG. 3, signals SW2, SW3, and SW4 are typically shown as the scan write signal SWi, and signals SR2, SR3, and SR4 are typically shown as the scan read signal SRi. The scan-in data SiD is supplied through the diagnostic data input section 42. A diagnostic control section 44 supplies a diagnostic master clock signal MC1, diagnostic slave clock signal C2, and clock signal CK1 to corresponding flip-flop circuit in accordance with various control signals CONT supplies through the diagnostic data input section 42. A scan data output section 45 outputs scan-out data SoD to outside.

Figure 4:
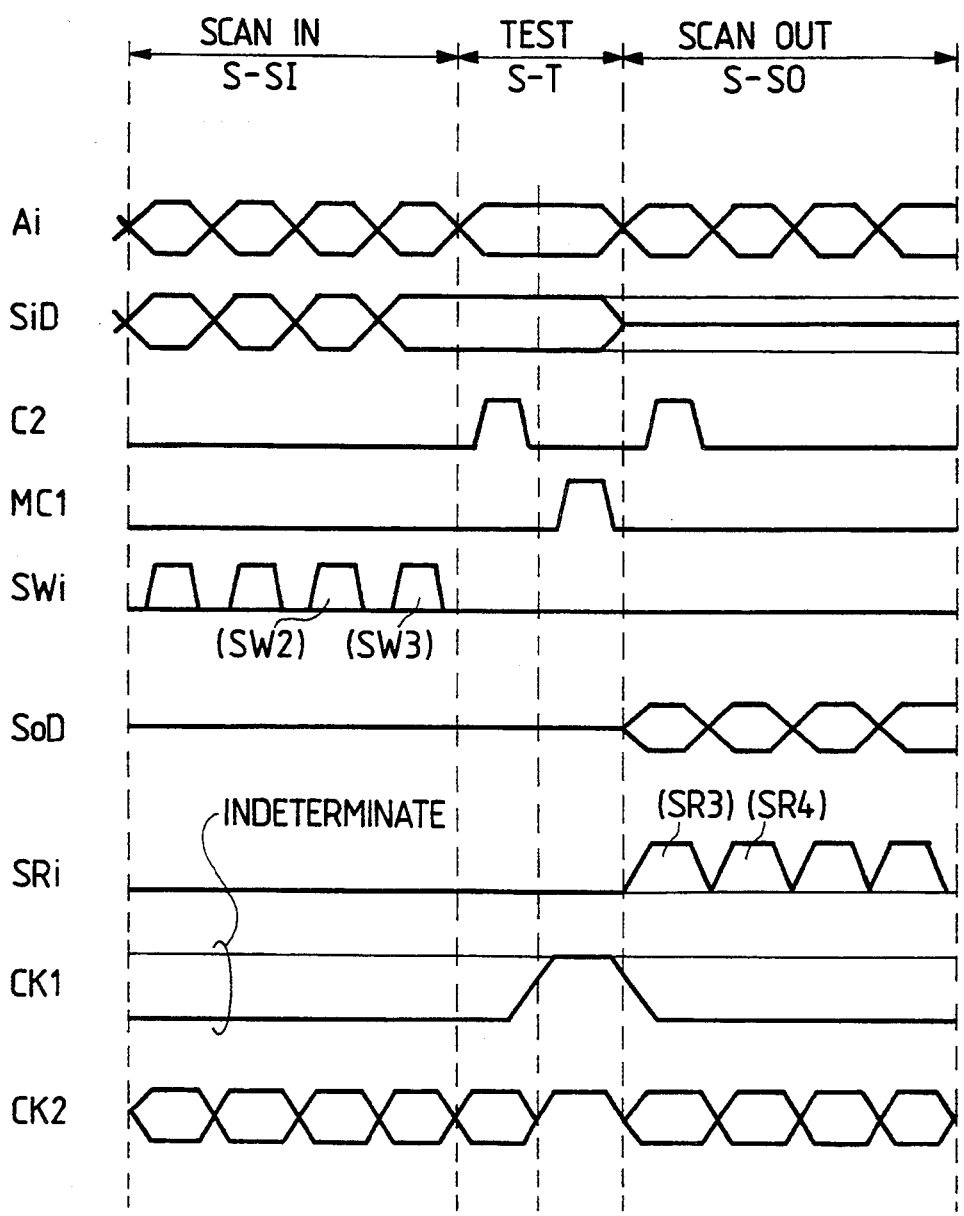
FIG. 4 is a timing chart under diagnosis using address scan.

FIG. 4 shows a timing chart under diagnosis using address scan. In FIG. 4, S-SI is a scan-in cycle for setting scan-in data in a flip-flop circuit, S-T is a test cycle for testing combinational circuit groups in accordance with the scan-in data, and S-SO is a scan-out cycle for obtaining the test result stored in the flip-flop circuits by the test cycle.

In the scan-in cycle S-SI, the scan-in data SiD is successively written in and held by the first storage circuit MF of the flip-flop circuit specified by the scan write signal SWi in accordance with the address signal Ai. In the logical block 41 in FIG. 3, for example, scan-in data is set in the flip-flop circuit FF2 by the scan write signal SW2 and scan-in data is set in the flip-flop circuit FF3 by the scan write signal SW3. Then, the scan write signals SWi (SW2 and SW3) are negated to the low level. In this case, the diagnostic slave block signal C2, diagnostic master clock signal MC1, and clock signal CK1 are brought into the low level and the scan-in data held by each first storage circuit MF is prevented from being transferred to the next stage.

In the test cycle S-T, the diagnostic slave clock signal C2 and diagnostic master clock signal C1 are clock-changed without overlap and the storage circuits MF and SF are master/slave-operated. In the logical block 41, for example, because the diagnostic slave clock signal C2 is first brought into the high level, the scan-in data held in the first storage circuit MF of the flip-flop circuit FF2 is written in the second storage circuit SF at the slave stage and supplied to the combinational circuit group CC1 of the next stage. At the same time, the scan-in data held in the first storage circuit MF of the flip-flop circuit FF3 is written in the second storage circuit SF of the slave stage and supplied to the combinational circuit group CC2 of the next stage. After the diagnostic master clock signal MC1 is brought into the high level, the outputs of the combinational circuit groups CC1 and CC2 are written in and held by the first storage circuits MF of the flip-flop circuits FF3 and FF4 of the respective next stages. In this case, because the second storage circuit SF is changed to the hold state, the output of the combinational circuit group CC1 does not influence the input of the combinational circuit group CC2.

In the scan-out cycle S-SO, the slave clock signal C2 is first brought into the high level and thereby the second flip-flop circuit SF fetches the test result held by the first storage circuit MF of each flip-flop circuit FF. Then, the scan-out data SoD is successively read from the second storage circuit SF of a flip-flop circuit specified by the control signal SRi in accordance with the address signal Ai. In the logical block 41, for example, the test result of the combinational circuit group CC1 held by the second storage circuit SF of the flip-flop circuit FF3 is read by the scan bus 30 synchronously with the scan read signal SR3, and the test result of the combinational circuit group CC2 held by the second storage circuit SF of the flip-flop circuit FF4 is read as the scan-out data synchronously with the scan read signal SR4.

By providing the first and second storage circuits MF and SF with master/slave constitution in diagnosis, the inputs of the next-stage combinational circuits do not change when setting the outputs of the combinational circuits in the receiving-side flip-flop circuits. Therefore, it is possible to set the response pattern of all combinational circuits in the divided diagnostic unit in the next-stage flip-flop circuits in one step and easily perform the diagnostic read of the response pattern data. Moreover, as represented by the combinational circuit group CC3 and flip-flop circuit FF5 in FIG. 2, it is possible to eliminate the restrictions such as the inhibition of a feedback circuit in the logical design of a gate array LSI by a user.

Figure 5:
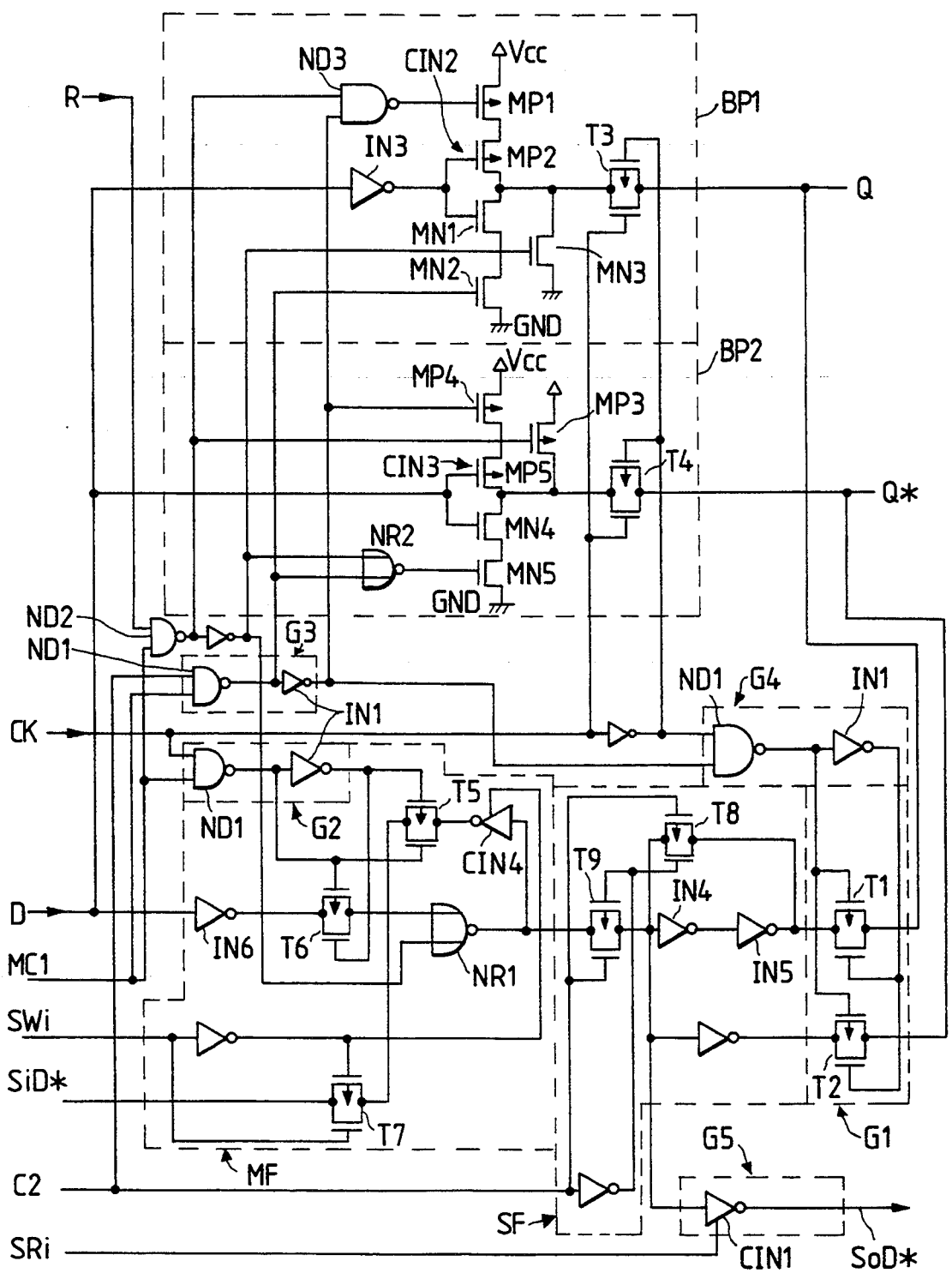
FIG. 5 is a typical further-detailed circuit diagram of the flip-flop circuit shown in FIG. 1.

FIG. 5 shows a further detailed embodiment of the flip-flop circuit shown in FIG. 1, and FIG. 6 shows the truth table of the circuit. In FIG. 5, the same circuit block as that in FIG. 1 is provided with the same symbol. The flip-flop circuit shown in FIG. 5 has a normal output Q and an inverted output Q* (the sign "*" means "inverted"), bypass circuits BP1 and BP2 corresponding to the Q and Q* outputs respectively, and a reset function. A symbol Vcc in FIG. 5 represents a supply voltage, e.g., 5, 3.3, or 2 V, and GND represents a ground voltage, e.g., 0 V. In FIG. 6 (and also in FIG. 9 which will be described later), a symbol Qm represents the output of a first storage circuit MF; Q0, Q0*, Qm0, and Qm0* represent that the previous state is held; H and L represent a high level and a low level respectively; # represents any logical value; L# represents that data is not assured after R, CK, and diagnostic master clock signal MC1 are stopped; and HiZ represents a high impedance.

In FIG. 5, the AND gates G2 to G4 in FIG. 1 are realized by a NAND gate ND1 and an inverter IN1 respectively. The output gate G1 is realized by a complementary-MOS (hereafter referred to as a CMOS) transfer gate T1 for normal outputs and a CMOS transfer gate T2 for inverted outputs. The output gate G5 is realized by a clocked inverter CIN1.

A bypass circuit BP1 for normal outputs has a normal transfer path for input data D, the path comprising an inverter IN3, a clocked inverter CIN2 having two p-channel MOS transistors MP1 and MP2, and two n-channel MOS transistors MN1 and MN2, and a CMOS transfer gate T3. A bypass circuit BP2 for inverted outputs has an inverted transfer path for the input data D, the path comprising a clocked inverter CIN3 having two p-channel MOS transistors MP4 and MP5 and two n-channel MOS transistors MN4 and MN5, and a CMOS transfer gate T4.

The write state and hold state of the first storage circuit MF are controlled mainly by a static latch comprising a CMOS transfer gate T5, NOR gate NR1, and clocked inverter CIN4, and by the CMOS transfer gate T5 and a CMOS transfer gate T6 arranged in the stage just before the static latch. The scan-in data SiD is given to the static latch through a CMOS transfer gate T7.

The write state and hold state of the second storage circuit SF are controlled mainly by a static latch comprising a transfer gate T8 and two inverters IN4 and IN5, and by the CMOS transfer gate T8 and a CMOS transfer gate T9 arranged in the stage just before the static latch.

The reset function for the flip-flop circuit shown in FIG. 5 is given to the first storage circuit MF and both bypass circuits BP1 and BP2. The reset signal R for instructing the reset operation by the high level is inputted to the NAND gate ND2 together with the diagnostic master clock signal MC1 and the reset operation is enabled when the output of the gate ND2 is at the high level. Therefore, the instruction of the reset operation is effected only when the MC1 is high. In this case, the diagnostic master clock signal CMOS is always brought into high level in the normal operation as previously described. Therefore, the reset instruction by the signal R is always effected in the normal operation. However, when scan-in data SiD* is written in diagnostic, the diagnostic master clock signal MC1 is brought into low level, and the write operation is controlled by the scan write signal SWi as described above. Therefore, it is possible to prevent scan-in data from being erroneously reset in the scan-in cycle. In other words, it is possible to ignore the reset signal R in the scan-in cycle.

The reset function of the first storage circuit MF is realized by supplying the inverted output of a NAND gate ND2 to a NOR gate NR1 and forcing the data held by the static latch including the gate NR1 into the low level. The reset function of a bypass circuit BP1 is realized by supplying the inverted output of the NAND gate ND2 to the gate of an n-channel pull-down MOS transistor MN3 and forcing the output of a clocked inverter CI2 into the low level. The reset function of the bypass circuit BP2 is realized by supplying the output of the NAND gate ND2 to the gate of a p-channel pull-up MOS transistor MP3 and forcing the output of a clocked inverter CI3 into the high level. Especially when the reset operation is instructed, a MOS transistor MP1 of the bypass circuit BP1 is cut off through a NAND gate ND3 so that a useless current does not flow through the pull-down MOS transistor MN3. Similarly, when the reset operation is instructed, a MOS transistor MN5 of the bypass circuit BP2 is cut off through a NOR gate NR2 so that a useless current does not flow from the pull-up MOS transistor MP3.

The following is further description of the constitution for controlling the operations of the bypass circuit BP1 and BP2 of the flip-flop circuit in FIG. 5. A clock signal CK supplied to the bypass circuits BP1 and BP2 switch-controls CMOS transfer gates T3 and T4 of the BP1 and BP2. A diagnostic slave clock signal C2 and a diagnostic master clock signal MC1 control a MOS transistor MN2 and the MOS transistor MN5 through a NAND gate ND1 included in a gate G3 and also control MOS transistors MP1 and MP4 through the NAND gate ND1 and an inverter IN1 included in the gate G3. Thereby, clocked inverters CIN2 and CIN3 of the bypass circuits BP1 and BP2 are brought into high impedance states when both the diagnostic master clock signal MC1 and the diagnostic slave clock signal C2 are at levels other than the high-levels, and the output operation of the inverters is inhibited regardless of the state of the clock signal CK.

In the flip-flop circuit 30, the number of gate stages through which data pass until the data is outputted after the clock signal CK is changed to the high level is decreased to a minimum, namely, only one stage is used in each of the transfer gates T3 and T4 in the bypass circuits BP1 and BP2. Therefore, the delay time until normal data is outputted after the clock signal CK changes is greatly decreased compared with that of a circuit having no bypass circuit.

The following is the description of the size of the MOS transistor constituting the flip-flop circuit FF. Assuming that the gate widths of MOS transistors MP2, MN1, MP5, and MN4, and those of the MOS transistors constituting the transfer gates T3 and T4 are the same and adopted as a reference gate width, the gate widths of the MOS transistors constituting inverters IN3 and IN6 receiving the input data D are approximately half the reference width. Thereby, the input capacitance is decreased and the transient response speed of the input data D is increased. Because parasitic capacitors of diodes are added to the output nodes of the MOS transistors MP3 and MN3 and the MOS transistors constituting transfer gates T1 and T2, the gate widths of these MOS transistors are approximately half the reference width. Moreover, because high speed operation is not required for system resetting, it does not matter to increase the gate input capacitances of the MOS transistors MP1, MN2, MP4, and MN5. For this reason, the gate widths of these transistors is set to values two to five times larger than the reference width in order to increase the driving capacities of the bypass circuits BP1 and BP2. Thus, the on-state resistance is greatly decreased. Therefore, the flip-flop circuit of this embodiment is most suitable for application modes such as unit cells or standard cells for automatic arrangement and routing as in design automation, in other words, application modes such that it is pressumed that the driving capacities and capacitive loads of circuits connected to the input/output terminals of semiconductor integrated circuit devices practically using such flip-flop circuits differ from one another.

Figure 7:
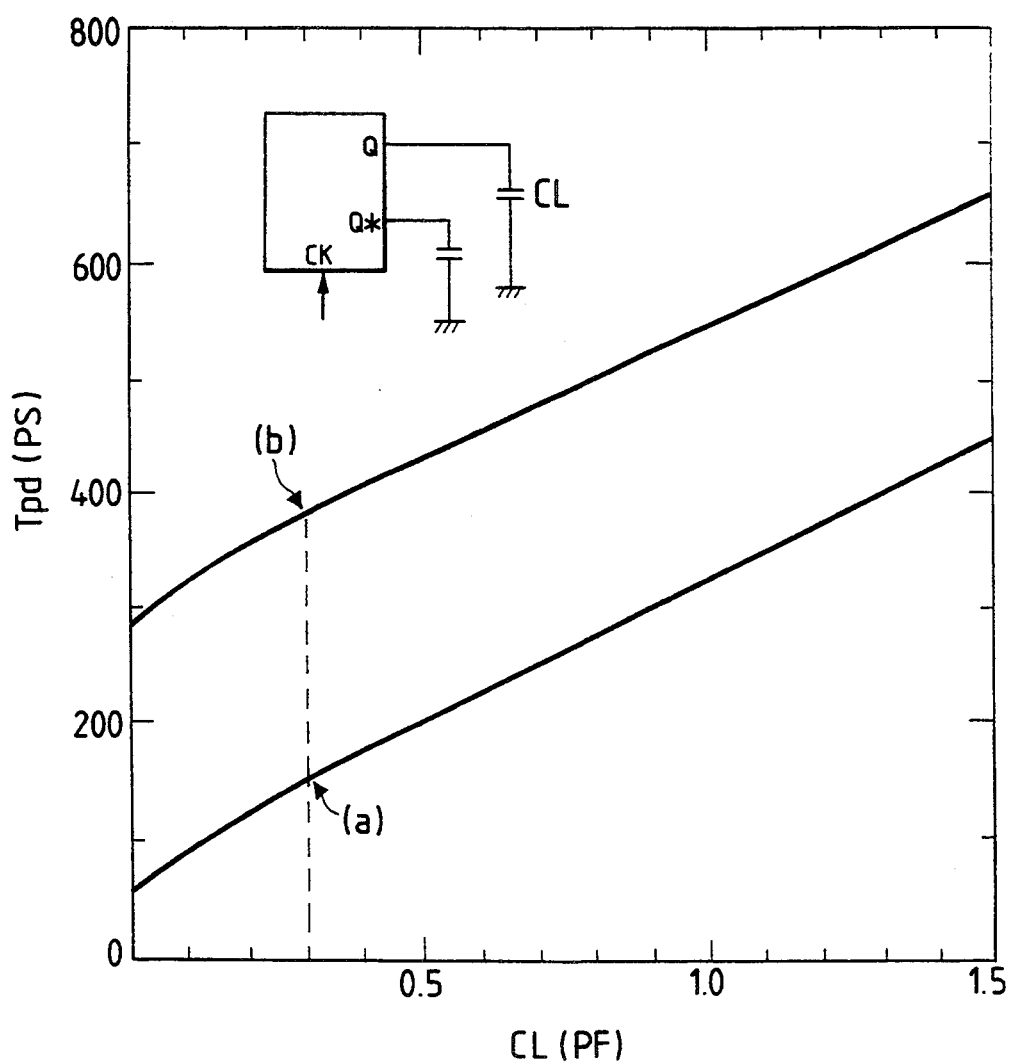
FIG. 7 is a typical characteristic diagram of the flip-flop circuit shown in FIG. 5.

In FIG. 7, the characteristic of the flip-flop circuit in FIG. 5 is shown by the curve (a). This characteristic shows the dependency of the delay time Tpd (average of the normal output Q and inverted output Q*) on the load capacitance CL until data is outputted to the terminal 21 after the clock signal CK is changed on the load capacitance CL while the data is being given to the input terminal 20. The curve (b) shows the characteristic of a circuit having no bypass circuit in the constitution of FIG. 5.

The characteristic when the load capacitance is 0.3 [PF] in the characteristic curve (a) is obtained from, for example, the simulation conditions below. That is, the flip-flop circuit comprises a complementary MOS circuit using a 0.2-[μm] process and the power supply voltage is assumed as 2.0 [V]. As for the standard-size of the MOS transistor, the gate length is 0.20 [μm] and the gate width is 15 [μm]. The standard-size complementary MOS inverter gate has an input capacitance of 0.05 [PF]. However, the MOS transistors MP1, MP4, MN2, and MN5 have a gate width of 45 [μm], and the MOST transistors constituting the inverters IN3 and IN6 and the transfer gates T1 and T2 and the MOS transistors MP3 and MN3 have a gate width of 7.5 [μm]. Though the load capacitance is not limited to the value of 0.3 [PF], it is determined as a reference load capacitance, considering the sum of the parasitic capacitance (0.18 [PF]) of the aluminum wiring with the length of 1 [mm] and the width of 0.7 [μm] and the gate input capacitance (0.1 [PF]) corresponding to the fan-out=2.

As typically shown by the characteristic curve (a), when the microcomputer MCU of this embodiment is constituted by a MOS semiconductor integrated circuit, the operations of not only flip-flop circuits but all other circuits are further accelerated up to the operation speed of present ECL circuits according to the scaling rule because elements are finely formed and thereby the supply voltage is further decreased. Moreover, large-scale integration and low power consumption are achieved which cannot be realized by ECL circuits and high-speed logical operation is realized in view of the performance of flip-flop circuits.

Figure 8:
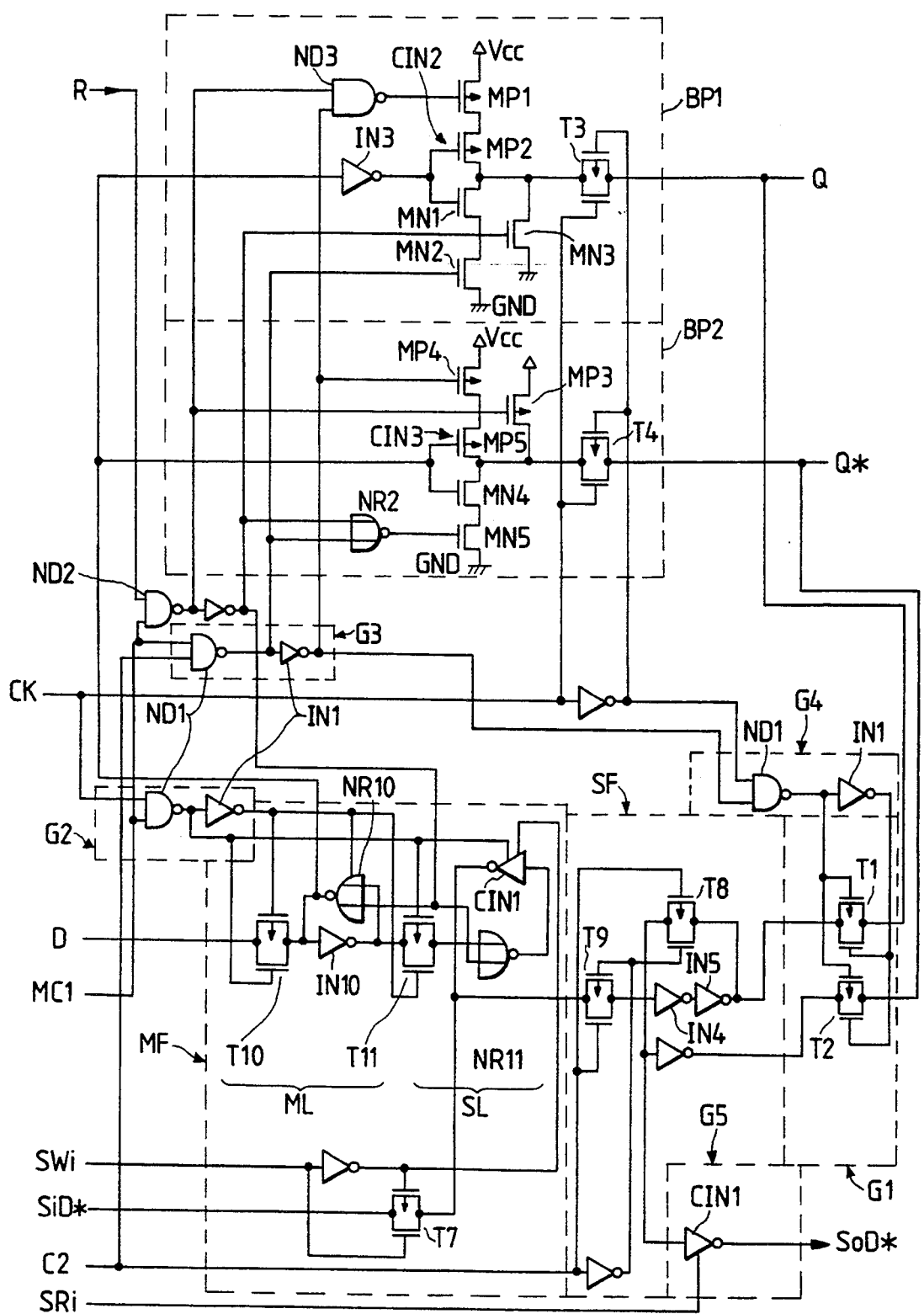
FIG. 8 is another further-detailed circuit diagram of the flip-flop circuit shown in FIG. 1.

FIG. 8 shows further-detailed another embodiment of the flip-flop circuit shown in FIG. 1, and FIG. 9 shows the truth value table of the circuit. The flip-flop circuit in FIG. 8 is different from the circuit in FIG. 5 is that the circuit in FIG. 8 uses an edge-trigger-type first storage circuit MF. That is, the first storage circuit MF has a master latch ML and a slave latch SL. The master latch MF comprises a CMOS transfer gate T10, an inverter IN10, and a NOR gate NR10. The slave latch SL comprises a CMOS transfer gate T11, a clocked inverter IN11, and a NOR gate NR11. The inputs of bypass circuits BP1 and BP2 are connected with the output of the NOR gate NR10. Input data D is given to the master latch ML and scan-in data SiD is directly given to the slave latch SL. In the first storage circuit MF, when the output of an inverter IN1 of an AND gate G2 is low and the output of a NAND gate ND1 is high, the master latch ML stores the input data D and the slave latch SL fetches the data D from the master latch ML to output it synchronously with the transition of the level inversion of the output of the inverter IN1 of the AND gate G2 and the output of the NAND gate ND1. When the output of the NAND gate ND1 is brought into the high level again and the output of the inverter IN1 of the AND gate G2 into the low level, the slave latch SL is brought into the data-D holding state. The scan-in data SiD is written in and held by the slave latch SL in accordance with the level of the scan write signal SWi.

The following advantages of the above embodiments are obtained.

(1) In the normal operation mode, the second storage circuit SF is brought into the data-through state, and the write state and hold state of the first storage circuit MF are alternately changed in accordance with the clock change of the clock signal CK. In this case, the bypass circuit BP outputs the data D from the input terminal 20 to the output terminal 21 depending on the write state of the first storage circuit MF. Because the bypass circuit BP performs no storing operation and has less serially-connected stored-gate stages than those of the storage circuits MF and SF and shorter information transfer delay occurring when the information is transferred from the man data input terminal 20 to the data output terminal 21 than those of the storage circuits MF and SF, the bypass circuit BP outputs the information corresponding to the above input data at a high speed before the output of the second storage circuit SF in the data-through state is determined. In the bypass circuits BP1 and BP2 in FIG. 5, for example, the number of gates through which the input data D passes until the output data Q and Q* are obtained after the clock signal CK is caused to go to the high level, is minimized, namely, only one stage is used in each of the transfer gates T3 and T4 in the bypass circuits BP1 and BP2. Therefore, it is possible to further decrease the time until the output data Q and Q* are obtained after the clock signal CK changes, compared with a constitution using no bypass circuit.

(2) As above mentioned, because the timing until the data inputted to the input terminal 20 of the flip-flop circuit FF is outputted to the output terminal 21 synchronously with the clock signal CK is advanced, it is possible to shorten the operation delay of the clock-synchronized-type flip-flop circuit FF. Therefore, in a microcomputer MCU whose performance is determined by the frequency of the clock signal CK for specifying the operation of a flip-flop circuit, it is possible to accelerate the operation of the microcomputer MCU because the frequency of the clock signal CK can be raised. In other words, it is possible to shorten the cycle time Tcyc in FIG. 11.

(3) In the diagnosis mode, the clock signal CK considered to be equivalent to a logical signal makes it possible to control the first storage circuit MF by its high level synchronously with the change of the diagnostic master clock signal MC1. Because the diagnostic master clock signal MC1 and diagnostic slave clock signal C2 are clock-changed without overlap, the first and second storage circuits MF and SF are master/slave-operated. In this state, the output of the AND gate G3 is fixed to the low level and thereby the output operation of the bypass circuit BP is inhibited regardless of the logical level of the clock signal CK. Therefore, it is possible to assure the master/slave operation of the first and second storage circuits MF and SF in the diagnosis mode.

(4) When the output of a combinational circuit is set in a receiving-side flip-flop circuit in the diagnosis mode, the input of the next-stage combinational circuit does not change because of the reason in Item (3). Therefore, it is possible to alternately in-phase-transfer-control the flip-flop circuits arranged before and after a combinational circuit even if the siganl frequency of the control-clock or synchronous-clock signal frequency in diagnosis is higher than that in the normal operation and even if the waveform of the signal is not sharp. Moreover it is possible to remove the restrictions such as the inhibition of a feedback circuit in the logical design of a gate array LSI by a user. Further more, in this case, the signal CK is not necessarily a clock signal and it can be considered to be equivalent to a logical signal. Therefore, any signal waveform can be used for diagnosis. In other words, no consideration of a clock system in diagnosis is necessary during the logical design.

(5) When the microcomputer MCU of this embodiment is constituted by a MOS semiconductor integrated circuit, it is possible to provide a flip-flop circuit FF having the operating characteristic typically shown by the characteristic curve (a) in FIG. 7 according to the scaling rule because elements are finely formed and thereby the supply voltage is further decreased. Not only the operations of flip-flop circuits but the overall operation of the microcomputer MCU are further accelerated up to the operation speeds of the present ECL circuits. Moreover, large-scale integration and low power consumption are achieved which cannot be realized by the ECL circuits.

(6) The output gate circuit G1 is provided between the output of the second storage circuit SF and the data output terminal 21. In the normal operation mode in which the diagnostic master clock signal MC1 and diagnostic slave clock signal C2 are in the high levels, the first storage circuit MF is turned into the write state by the high level of the clock signal CK. Also, when the output operation of the bypass circuit BP is enabled, the output gate circuit G1 is brought into the cut-off state. Therefore, it is possible to prevent the contention between the information held before written in the first storage circuit MF and the output information of the bypass circuit BP. In the diagnosis mode in which the diagnostic master clock signal MC1 and diagnostic slave clock signal C2 are clock-changed without overlap, the output of the AND gate G3 is always kept at the low level. Therefore, the output gate circuit G1 is always made ready for the output operation and does not influence the master/slave operations of the first storage circuit MF and second storage circuit SF.

(7) It is possible to accelerate the transient response of input data by the amplifying action of the clocked inverters CIN2 and CIN3 arranged before and after the transfer gates T3 and T4 depending on the size of the transistors constituting the inverters, and it is possible to output data without being influenced by the output load capacitance. Therefore, the flip-flop circuit FF is most suitable for unit cells and standard cells for automatic arrangement and routing when the driving capacities and capacitive loads of circuits connected to the input-/output terminals of the circuit FF differ from one another in every semiconductor integrated circuit apparatus to which the flip-flop circuits FF are used.

(8) Because the reset function of the flip-flop circuit FF is given to the first storage circuit MF and the bypass circuits BP1 and BP2, it is also possible to preferentially give the reset instruction to the bypass circuit in an active state similarly to the first storage circuit MF.

(9) The reset signal R for instructing the reset operation by its high level and the diagnostic master clock signal MC1 are inputted to the NAND gate ND2, and the reset operation is executed when the output of the gate is at the high-level. In other words, the instruction of the reset operation is effected only when MC1 is at the high-levle. In this case, because the diagnostic master clock signal MC1 is always kept at the high level in the normal operation mode, the reset instruction by the signal R is always effective in the normal operation mode. However, because the diagnostic master clock signal MC1 is at the low level and the write operation is controlled by the scan write signal SWi when the scan-in data SiD is written in diagnosis, it is possible to prevent scan-in data from being erroneously reset in the scan-in cycle. In other words, it is possible to ignore the reset signal R in the scan-in cycle.

The invention made by the inventor has been concretely described above according to embodiments. However, the present invention is not restricted to the embodiments but various embodiments are allowed as long as they meet the gist of the present invention.

For example, the information storing form for a storage circuit is not restricted to those of the above embodiments but other circuit forms can be used according to necessity. The bypass circuit is not restricted to the combination of a clocked inverter gate with a transfer gate but it can be constituted by using other types of gates. The flip-flop circuits of the above embodiments are provided with the reset function. However, the present invention is not restricted to the embodiments. Any flip-flop circuits having the reset function, both the set and reset functions, or no set nor reset function are allowed. Though the above embodiments have both the normal and inverted outputs, it is possible to provide them with either output. The operating characteristic of the flip-flop circuits incorporated in a semiconductor integrated circuit according to the present invention is not restricted to the characteristic curve (a) in FIG. 7 and its simulation conditions, but any other operating characteristics are allowed as long as they follow the scaling rule of MOS semiconductor integrated circuits. Moreover, flip-flop circuits can be made up of BI-CMOS circuits including bipolar tarnsistors and MOS transistors in view of the improvement of the driving capacity of the flip-flop circuits. Furthermore, the diagnostic method applicable to the flip-flop circuits of the above embodiments is not restricted to the address scanning method but the shift scanning method is allowed.

The above description is mainly made in the case in which the invention made by the inventor is applied to a microcomputer comprising a MOS semiconductor integrated circuit which is included in the application field of the present invention. However, the present invention is not restricted to the microcomputer but it can be widely applied to various logic LSIs. The present invention can be widely applied to semiconductor integrated circuits following the condition that the operating performance of a flip-flop circuit arranged at least in an information transfer path influences the logical operation speed of the entire LSI.

The following is the brief description of the advantages of the representatives of the inventions disclosed in this application.

The bypass circuit connected in parallel with the serial path of the first and second storage circuits has less serially-connected stages of the gates incorporated therein and shorter information transfer delay than the storage circuits. Therefore, when the data supplied to the data input terminal is fetched synchronously with a clock signal, the bypass circuit outputs the information to the output terminal before the output of the storage circuit is determined. Therefore, there is an advantage that it is possible to accelerate the logical operation of a semiconductor integrated circuit whose performance is determined by the clock signal frequency for specifying the operation of sequential circuits.

The first and second storage circuits are master/slave-operated in the diagnosis mode, and the output operation of the bypass circuit is inhibited according to the state of the signal for controlling the master-slave operation. Therefore, the output operation of the bypass circuit is inhibited regardless of the clock change of the first control signal. Thus, it is possible to assure the master/slave operation of the first and second storage circuits in the diagnosis mode.

As described above, when the output of a combinational circuit is set in a receiving-side sequential circuit in the diagnosis mode, the input of the next-stage combinational circuit does not change. Therefore, it is possible to mutually control the in-phase transfer of the sequential circuits arranged before and after the combinational circuit even if the signal frequency of the control-clock in diagnosis is higher than that in normal operation, and even if the waveform of the signal is not sharp. Moreover it is possible to remove the restrictions such as the inhibition of a feedback circuit in the logical design of a gate array LSI by a user. Furthermore, in this case, the first control signal is not necessarily a clock signal and it can be considered to be equivalent to a logical signal. Therefore, any singal waveform can be used for diagnosis. Thus, a further advantage is obtained that any consideration for a clock system for diagnosis is unnecessary during the logical design.

There is another advantage that it is possible to further accelerate the overall operation according to the scaling rule by constituting a semiconductor integrated circuit using the sequential circuits with MOS semiconductor integrated circuits and finely forming the elements and thereby further decreasing the power supply voltage and, it is also possible to further accelerate the logical operation of the semiconductor integrated circuit according to the performance of the sequential circuits.

The scan-in of diagnostic data from a scan bus is realized by controlling the write and hold states of the first storage circuit, in which the diagnostic data sent from a diagnostic data input terminal can be written and held, according to the fourth control signal. The scan-out of diagnostic data to the scan bus is realized by further adding diagnostic data output terminals to be connected to the output of the second storage circuit.

By providing an output circuit which is cut-off-controlled according to the state of the bypass circuit ready for output between the output of the second storage circuit and the data output terminal, it is possible to prevent the contention between the information held before written in the storage circuit and the output information of the bypass circuit. By providing the bypass circuit with a driver circuit for driving the load to be connected to the data output terminal, it is possible to make the setup times and hold times of the sequential circuits not greatly depend on the amount of the capacitive load to be connected to the data output terminal. This contributes to the stabilization of the operation regardless of the application modes of sequential-circuits or to the standardization of the operating specifications. By providing the bypass circuit with a function for resetting the first storage circuit by the reset instructing signal when the first storage circuit has the reset function, it is possible to give priority to the reset instruction to the bypass circuit.

What is claimed is:

1. A semiconductor integrated circuit including a sequential circuit capable of operating synchronously with a clock signal comprising:

a first storage circuit having a write state and hold state where input data supplied from a main data input terminal can be written and held is controlled in accordance with first and second control signals;

a second storage circuit coupled between said first storage circuit and a data output terminal, having a write state and hold state in which output data from the first storage circuit can be written and held are controlled in accordance with a third control signal; and a bypass circuit connected to the main data input terminal and the data output terminal, in which data transfer time until the input data supplied from the main data input terminal reaches the data output terminal is shorter than time taken for the input data to pass through both the storage circuits, an output operation of the bypass circuit is inhibited according to states of the second and third control signals when the second and third control signals master/slave operate the first and second storage circuits, and the output operation of the bypass circuit to transfer data to the data output terminal is enabled according to the state of the third control signal when the second storage circuit is instructed to operate in a normal write state and according to the states of the first and second control signals for controlling the state where the input data sent from the main data input terminal is written in the first storage circuit;

wherein the sequential circuit comprises the first storage circuit, second storage circuit, and bypass circuit.

2. A semiconductor integrated circuit according to claim 1, wherein the write state and hold state of the first storage circuit, in which diagnostic data sent from a diagnostic data input terminal to the first storage circuit can be written and held, is further controlled in accordance with a fourth control signal.

3. A semiconductor integrated circuit according to claim 2 further includes a diagnostic data output terminal coupled to another output of the second storage circuit.

4. A semiconductor integrated circuit according to claim 3, wherein an output gate circuit to be cut-off-controlled according to an output-ready state of the bypass circuit is provided between the output of the second storage circuit and the data output terminal.

5. A semiconductor integrated circuit according to claim 4, wherein the bypass circuit is provided with a drive circuit for driving a load to be connected to the data output terminal.

6. A semiconductor integrated circuit according to claim 5, wherein
the bypass circuit has means for forcing data to be outputted to the data output terminal into a predetermined logical value according to a fifth control signal, and
the first storage circuit has means for forcing the data held by the first storage circuit into a predetermined logical value according to the fifth control signal.

7. A semiconductor integrated circuit according to claim 1, wherein the circuit is formed in one chip as a microcomputer.

8. A semiconductor integrated circuit having a circuit, including:
a storage circuit coupled to said circuit; and
a diagnostic control circuit coupled to said storage circuit for controlling said storage circuit, wherein said storage circuit comprises:
a data input terminal and a data output terminal;
a first storage circuit coupled to the data input terminal, including means for writing input data from the data input terminal into said first storage circuit in response to a first state of a signal, and means for holding the written input data in response to a second state of the signal;
a second storage circuit coupled between an output of the first storage circuit and the data output terminal, and including means for writing and holding output data from the first storage circuit; and
a bypass circuit, coupled between the data input terminal and the data output terminal, coupled to the diagnostic control circuit, and including a first function for transmitting data in accordance with the input data from the data input terminal to the data output terminal and a second function for inhibiting an execution of the first function if the diagnostic control circuit indicates diagnosis.

9. The semiconductor integrated circuit according to claim 8, wherein said storage circuit further comprises a gate circuit coupled between the data output terminal and an output of the second storage circuit.

10. The semiconductor integrated circuit according to claim 8, wherein data transfer time which is required to transfer data in accordance with the input data from the data input terminal to the data output terminal is shorter than time taken for transmitting the data through both the first storage circuit and the second storage circuit.

11. The semiconductor integrated circuit according to claim 8, wherein said storage circuit further comprises a diagnostic input terminal coupled to the first storage circuit, and wherein the first storage circuit is coupled to the diagnostic control circuit and includes a means for writing and holding diagnostic data from the diagnostic input terminal in response to a diagnostic indication from the diagnostic control circuit.

12. The semiconductor integrated circuit according to claim 11, wherein said storage circuit further comprises a diagnostic output terminal coupled to the second storage circuit, and wherein the second storage circuit includes a means for outputting diagnostic data to the diagnostic output terminal in response to a diagnostic indication from the diagnostic control circuit.

13. The semiconductor integrated circuit according to claim 12, wherein said storage circuit further comprises diagnostic control terminals for receiving diagnostic indications from the diagnostic control circuit.

14. The semiconductor integrated circuit according to claim 13, wherein data transfer time which is required to transfer data in accordance with the input data from the data input terminal to the data output terminal is shorter than time taken for transmitting the data through both the first storage circuit and the second storage circuit.

15. The semiconductor integrated circuit according to claim 14, wherein said storage circuit comprises a gate circuit coupled between the data output terminal and an output of the second storage circuit.

16. The semiconductor integrated circuit according to claim 8, wherein said storage circuit further comprises a diagnostic output terminal coupled to the second storage circuit, the second storage circuit including a means for outputting diagnostic data to the diagnostic output terminal in response to a diagnostic indication from the diagnostic control circuit.

17. A semiconductor integrated circuit having a circuit, including:
a storage circuit coupled to said circuit; and
a diagnostic control circuit coupled to said storage circuit for controlling said storage circuit, wherein said storage circuit comprises:
a data input terminal and a data output terminal;
a master flip-flop circuit coupled to the data input terminal;
a slave flip-flop circuit coupled between an output of the master flip-flop circuit and the data output terminal; and
a bypass circuit, coupled between the data input terminal and the data output terminal, coupled to the diagnostic control circuit, and including a first function for transmitting data in accordance with the input data from the data input terminal to the data output terminal and a second function for inhibiting an execution of the first function if the diagnostic control circuit indicates diagnosis.

18. The semiconductor integrated circuit according to claim 17, wherein data transfer time required to transfer data in accordance with the input data from the data input terminal to the data output terminal is shorter than time taken for transmitting the data through both the master flip-flop circuit and the slave flip-flop circuit.

19. The semiconductor integrated circuit device according to claim 17 wherein said storage circuit further comprises a diagnostic input terminal coupled to the master flip-flop circuit, and wherein the master flip-flop circuit is coupled to the diagnostic control circuit and includes a means for writing and holding in the master flip-flop circuit diagnostic data from the diagnostic input terminal in response to a diagnostic indication from the diagnostic control circuit.

20. The semiconductor integrated circuit according to claim 19, wherein the storage circuit further comprises a diagnostic output terminal coupled to the slave flip-flop circuit, and wherein the slave flip-flop circuit includes a means for outputting diagnostic data to the diagnostic output terminal in response to a diagnostic indication from the diagnostic control circuit.

21. The semiconductor integrated circuit according to claim 19, wherein data transfer time which is required to transfer data in accordance with the input data from the data input terminal to the data output terminal is shorter than time taken for transmitting the data through both the master flip-flop circuit and the slave flip-flop circuit.

22. The semiconductor integrated circuit according to claim 21, wherein said storage circuit further comprises a gate circuit coupled between the data output terminal and the output of the slave flip-flop circuit.

23. The semiconductor integrated circuit according to claim 17, wherein said storage circuit further comprises a diagnostic output terminal coupled to the slave flip-flop circuit, and wherein the slave flip-flop circuit includes a means for outputting diagnostic data to the diagnostic output terminal in response to a diagnostic indication from the diagnostic control circuit.

24. The semiconductor integrated circuit device according to claim 14, wherein the semiconductor integrated circuit is formed in one chip as a microcomputer.

25. The semiconductor integrated circuit according to claim 21, wherein the semiconductor integrated circuit is formed in one chip as a microcomputer.

* * * * *